(12) United States Patent
Bae et al.

(10) Patent No.: US 10,854,690 B2
(45) Date of Patent: Dec. 1, 2020

(54) DISPLAY APPARATUS

(71) Applicant: SAMSUNG DISPLAY CO., LTD., Yongin-si (KR)

(72) Inventors: Injun Bae, Yongin-si (KR); Donghwi Kim, Yongin-si (KR); Chulho Kim, Yongin-si (KR); Jin Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/686,800

(22) Filed: Nov. 18, 2019

(65) Prior Publication Data

US 2020/0258953 A1 Aug. 13, 2020

(30) Foreign Application Priority Data

Feb. 13, 2019 (KR) .................. 10-2019-0016841

(51) Int. Cl.
| | | |
|---|---|---|
| *H04L 27/32* | (2006.01) | |
| *H01L 27/32* | (2006.01) | |
| *H01L 51/52* | (2006.01) | |

(52) U.S. Cl.
CPC ...... *H01L 27/3227* (2013.01); *H01L 27/3248* (2013.01); *H01L 51/5237* (2013.01); *H01L 2251/301* (2013.01)

(58) Field of Classification Search
CPC ............. H01L 27/3227; H01L 27/3246; H01L 27/3248; H01L 27/3276; H01L 27/3272; H01L 51/5221; H01L 51/5237; H01L 51/5246; H01L 51/5206
See application file for complete search history.

(56) References Cited

U.S. PATENT DOCUMENTS

| | | | |
|---|---|---|---|
| 5,754,342 | A | 5/1998 | Ohnishi |
| 2017/0288003 | A1* | 10/2017 | Kim .................... H01L 27/3276 |
| 2018/0107241 | A1 | 4/2018 | Evans, V et al. |
| 2018/0129328 | A1 | 5/2018 | Park et al. |
| 2019/0237533 | A1* | 8/2019 | Kim .................... H01L 27/3276 |
| 2019/0245159 | A1* | 8/2019 | Kim .................... H01L 27/3246 |

FOREIGN PATENT DOCUMENTS

| | | |
|---|---|---|
| JP | 1993-249449 | 9/1993 |
| JP | 1995-181470 | 7/1995 |
| JP | 2010-230797 | 10/2010 |
| KR | 10-2018-0050473 | 5/2018 |

* cited by examiner

*Primary Examiner* — Cuong Q Nguyen
(74) *Attorney, Agent, or Firm* — F. Chau & Associates, LLC

(57) ABSTRACT

A display apparatus includes a substrate including a display area and a sensor area, the sensor area including an auxiliary display area and a transmitting area, first display elements arranged over the display area, second display elements arranged over the auxiliary display area, transmitting units arranged in the transmitting area and configured to transmit at least a portion of light incident on the transmitting units, and an optical layer including a mesh pattern covering at least the second display elements.

20 Claims, 11 Drawing Sheets

DISPLAY APPARATUS

CROSS-REFERENCE TO RELATED APPLICATION

This application claims priority under 35 U.S.C. 119 to Korean Patent Application No. 10-2019-0016841, filed on Feb. 13, 2019, in the Korean Intellectual Property Office, the disclosure of which is incorporated by reference herein in its entirety.

BACKGROUND

1. Field

The present inventions relate to a display apparatus, more particularly, a display apparatus with a diffraction grating.

2. Description of the Related Art

Recently, display apparatuses have been used for various applications. As display apparatuses can be manufactured to be thin and light, use thereof has widened.

While an area of a display apparatus occupied by a display area is increased, various functions grafted onto or associated with a display apparatus have been added. To add various functions while increasing an area of the display area, display apparatuses in which various components may be arranged over the display area have been studied.

SUMMARY

One or more embodiments include a display apparatus in which a sensor area where a sensor, etc. may be arranged is inside a display area.

Additional aspects will be set forth in part in the description which follows and, in part, will be apparent from the description, or may be learned by practice of the presented embodiments.

According to an exemplary embodiment of the present invention, a display apparatus includes a substrate including a display area and a sensor area, the sensor area including an auxiliary display area and a transmitting area, a plurality of first display elements arranged over the display area, a plurality of second display elements arranged over the auxiliary display area, a plurality of transmitting units arranged in the transmitting area and configured to transmit at least a portion of light incident on the transmitting unit, and an optical layer including a mesh pattern covering at least the plurality of second display elements.

According to an exemplary embodiment of the present invention, a display apparatus includes a substrate including a display area and a sensor area, the sensor area including an auxiliary display area and a transmitting area, a plurality of first display elements arranged over the display area, a plurality of second display elements arranged over the auxiliary display area, a plurality of transmitting units arranged in the transmitting area and configured to transmit at least a portion of light incident on the transmitting unit, and an optical layer including a diffraction grating covering at least the plurality of second display elements. The number of the plurality of second display elements per a unit area is less than the number of the plurality of first display elements per the unit area.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF EXEMPLARY EMBODIMENTS

Figure 1:
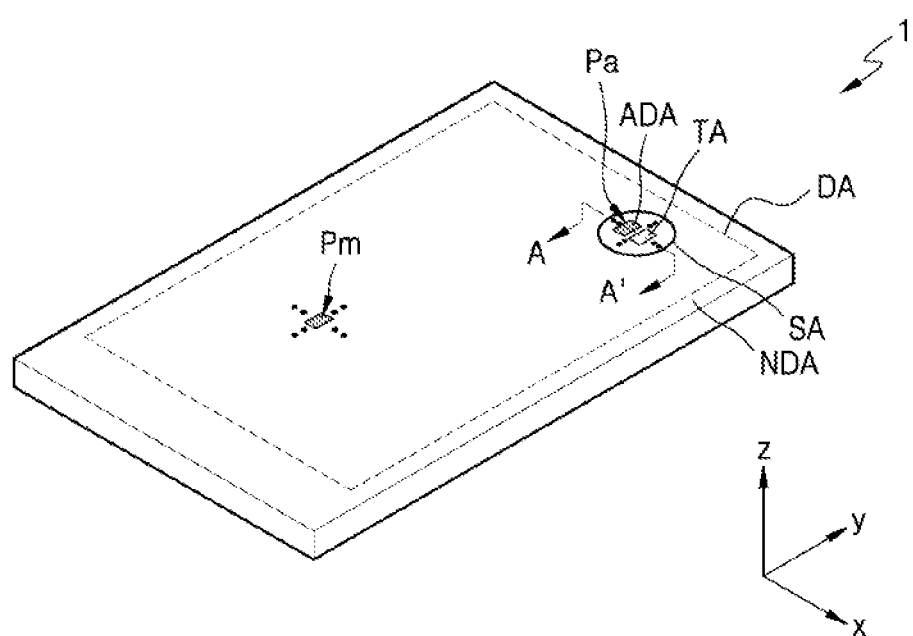
FIG. 1 is a schematic perspective view of a display apparatus according to an embodiment.

As the present description allows for various changes and numerous embodiments, certain embodiments will be illustrated in the drawings and described in detail in the written description. In this regard, the present embodiments may have different forms and should not be construed as being limited to the descriptions set forth herein. Accordingly, the embodiments are merely described below, by referring to the figures, to explain aspects of the present description. In the present description, detailed explanations of the related art are omitted when it is deemed that they obscure the essence of the present description.

While such terms as "first" and "second" may be used to describe various components, such components must not be limited to the above terms. The above terms are used only to distinguish one component from another.

It will be further understood that when a portion such as a layer, a film, an area, or a plate is referred to as being "on" another portion, it can be directly or indirectly on the other portion. That is, for example, an intervening layer, film, area, or plate may be present.

In the present description, the x-axis, the y-axis and the z-axis are not limited to the three axes of the rectangular coordinate system and may be interpreted in a broader sense. For example, the x-axis, the y-axis, and the z-axis may be perpendicular to one another, or may represent different directions that are not perpendicular to one another.

Reference will now be made in detail to embodiments, examples of which are illustrated in the accompanying drawings, wherein like reference numerals refer to like elements throughout and repeated descriptions thereof are omitted. Thickness of layers and areas in the drawings are enlarged for clear representation. In addition, thickness of some layers and areas in the drawings are exaggerated for convenience of explanation.

The singular forms "a," "an," and "the" used herein are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic perspective view of a display apparatus 1 according to an embodiment.

Referring to FIG. 1, the display apparatus 1 includes a display area DA where an image is displayed, and a non-display area NDA where no image is displayed. The display apparatus 1 may provide a main image by using light emitted from a plurality of main pixels Pm arranged over the display area DA.

The display apparatus 1 includes a sensor area SA. As described below with reference to FIG. 2, the sensor area SA may be an area in which a component such as a sensor using infrared light, visible rays, sound, or the like is disposed. In an example embodiment, a plurality of auxiliary pixels Pa, which will be describe later, may be formed in the sensor area SA, and the sensor may be disposed under the auxiliary pixels Pa. The sensor area SA includes a transmitting area TA through which outputting light and/or sound from the component to the outside or receiving them from the outside toward the component. According to an embodiment, when infrared light passes through the sensor area SA, light transmittance may be about 10% or greater, for example, 20% or greater, 25% or greater, 50% or greater, 85% or greater, or 90% or greater.

In the present embodiment, a plurality of auxiliary pixels Pa are arranged over the sensor area SA. A predetermined image may be provided by using light emitted from the plurality of auxiliary pixels Pa. An image provided from the sensor area SA is an auxiliary image, and may have low resolution compared to an image provided from the display area DA. That is, since the sensor area SA includes the transmitting area TA where light and/or sound may pass, the number of the auxiliary pixels Pa that may be arranged per a first unit area may be less than the number of the main pixels Pm that are arranged per a second unit area. In an example embodiment, the first unit area and the second unit area may be the same.

The sensor area SA may be at least partially surrounded by the display area DA, and according to an embodiment, FIG. 1 shows the sensor area SA entirely surrounded by the display area DA.

Although an organic light-emitting display apparatus is described below as an example of the display apparatus 1 according to an embodiment, a display apparatus of the present description is not limited thereto. According to another embodiment, various display apparatuses such as an inorganic light-emitting display apparatus, a quantum dot light-emitting display apparatus, or the like may be used.

Although FIG. 1 shows the sensor area SA on a side (right upper side) of the display area DA having a rectangular shape, the present description is not limited thereto. The display area DA may be circular, oval, or polygonal, for example, triangular or pentagonal, and a location of the sensor area SA and the number of sensor areas SA may also be variously modified.

Figure 2:
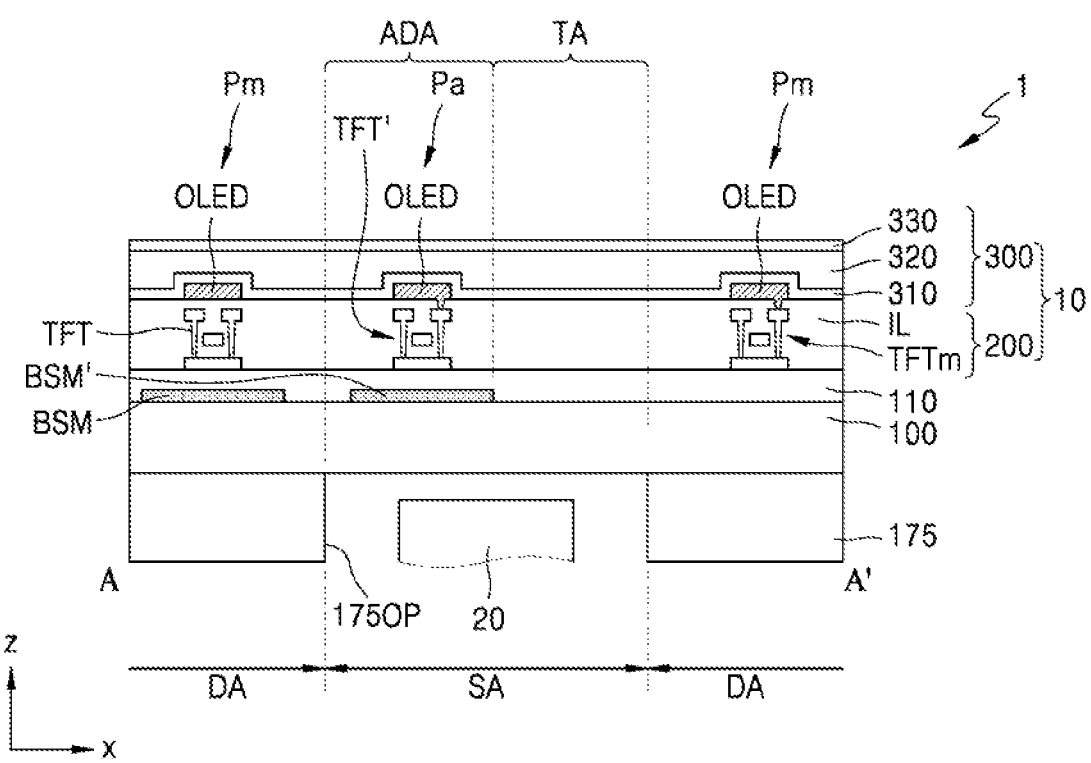
FIG. 2 is a cross-sectional view along line A-A' of FIG. 1.

FIG. 2 is a schematic cross-sectional view of the display apparatus 1 according to embodiments and corresponds to a cross-section according to line A-A' of FIG. 1.

Referring to FIG. 2, the display apparatus 1 includes a display panel 10 including a display element, and a component 20 disposed in the sensor area SA.

The display panel 10 includes a substrate 100, a display element layer 200 on the substrate 100, and a thin film encapsulation layer 300 which is a sealing member for sealing the display element layer 200. The display panel 10 may further include a lower protective film 175 under the substrate 100.

The substrate 100 may include glass or polymer resin. The polymer resin may include polyethersulfone (PES), polyacrylate, polyetherimide (PH), polyethylene naphthalate (PEN), polyethylene terephthalate (PET), polyphenylene sulfide (PPS), polyarylate (PAR), polyimide (PI), polycarbonate (PC), cellulose acetate propionate (CAP), or the like. The substrate 100 including polymer resin may be flexible, rollable, or bendable. The substrate 100 may have a multi-layer structure including a layer including the above-described polymer resin and an inorganic layer (not shown).

The display element layer 200 includes a circuit layer including a main thin film transistor TFT, an auxiliary thin film transistor TFT', an organic light-emitting diode OLED serving as a display element, and an insulating layer IL therebetween.

Each of the plurality of main pixels Pm including the main thin film transistor TFT and the organic light-emitting diode OLED connected thereto may be in the display area DA, and each of the plurality of auxiliary pixels Pa including the auxiliary thin film transistor TFT and the organic light-emitting diode OLED connected thereto, and lines (not shown) may be in the sensor area SA.

The sensing area SA includes the transmitting area TA where the auxiliary thin film transistor TFT' and the display element are not arranged. The transmitting area TA may be understood as an area through which light/a signal emitted from the component 20 or incident on the component 20 may be transmitted.

The component 20 may be in the sensor area SA. The component 20 may be an electronic element using light or sound. For example, the component 20 may be a sensor, such as an infrared sensor, receiving and using light, a sensor outputting and sensing light or sound to measure a distance or recognize a fingerprint, a small lamp outputting light, or a speaker outputting sound. The electronic element using light may use light of various wavelength bands such as visible light, infrared light, ultraviolet light, etc. The component 20 in the sensor area SA may be plural. For example, a light-emitting device and a light-receiving device may be provided together as components 20 in the sensor area SA. Alternatively, a light-emitting unit and a light-receiving unit may be simultaneously included in one component 20.

In the present embodiment, a first electrode layer BSM is disposed in the display area DA, and a second electrode layer BSM' is disposed in the sensor area SA. The first electrode layer BSM may correspond to the main pixels Pm, and the second electrode layer BSM' may correspond to the auxiliary pixels Pa. For example, the first electrode layer BSM is disposed under each of the main pixels Pm, and the second electrode layer BSM' is disposed under each of the auxiliary pixels Pa.

According to an embodiment, the first electrode layer BSM and the second electrode layer BSM' may be arranged between the substrate 100 and a buffer layer or on an intermediate layer of the buffer layer.

The first electrode layer BSM and the second electrode layer BSM' may respectively correspond to the bottom of the main thin film transistor TFT and the bottom of the auxiliary thin film transistor TFT'. For example, the first electrode layer BSM and the second electrode layer BSM' are respectively disposed under the bottom of the main thin film transistor TFT and the bottom of the auxiliary thin film transistor TFT'. The first electrode layer BSM may stabilize characteristics of the main thin film transistor TFT included in a corresponding main pixel of the main pixels Pm, and the second electrode layer BSM' may prevent external light from reaching a corresponding auxiliary pixel of the auxiliary pixels Pa including the auxiliary thin film transistor TFT'. For example, the external light may be light emitted from the component 20. In addition, constant voltage or a signal may be applied to the second electrode layer BSM', and thus, damage to a pixel circuit caused by electrostatic discharge may be prevented.

The thin film encapsulation layer 300 may include at least one inorganic encapsulation layer and at least one organic encapsulation layer. In this regard, FIG. 2 shows a first inorganic encapsulation layer 310, a second inorganic encapsulation layer 330 and an organic encapsulation layer 320 therebetween.

Each of the first inorganic encapsulation layer 310 and the second inorganic encapsulation layer 330 may include at least one inorganic insulating material from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include acrylic resin, epoxy-based resin, PI, polyethylene, etc.

The lower protective film 175 is attached to the bottom of the substrate 100. The lower protective film 175 may support and protect the substrate 100. The lower protective film 175 includes an opening 1750P corresponding to the sensor area SA. For example, the sensor area SA may be defined by the perimeter of the opening 1750P. The opening 1750P may be included in the lower protective film 175 to increase light transmittance of the sensor area SA. The lower protective film 175 may include PET or PI.

An area of the sensor area SA may be greater than an area where the component 20 is provided. Accordingly, an area of the opening 1750P included in the lower protective film 175 may not be the same as the area of the sensor area SA. For example, the area of the opening 1750P may be less than the area of the sensor area SA.

Although not shown, an input sensing member for sensing touch input, a reflection preventing member including a polarizer and a retarder or a color filter and a black matrix, and a component such as a transparent window may be further arranged on the display panel 10.

Although, in the present embodiment, the thin film encapsulation layer 300 may be used as an encapsulating member for sealing the display element layer 200, the present description is not limited thereto. For example, a sealing substrate which is bonded to the substrate 100 by a sealant or a frit may be used as a member for sealing the display element layer 200.

Figure 3:
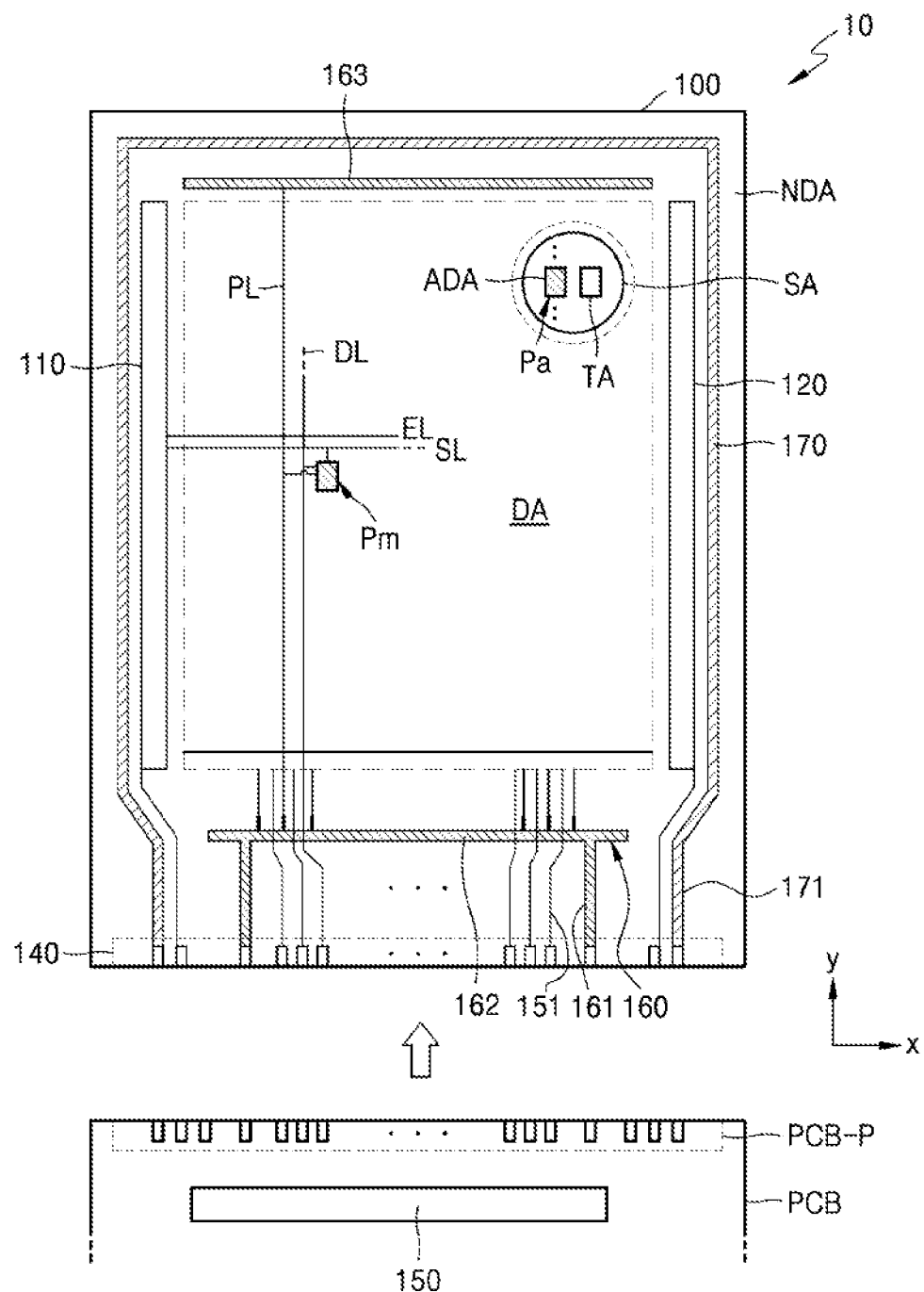
FIG. 3 is a schematic plan view of a display panel according to an embodiment.

FIG. 3 is a schematic plan view of the display panel 10 according to an embodiment.

Referring to FIG. 3, the display area DA of the display panel 10 includes the plurality of main pixels Pm. The plurality of main pixels Pm may each include a display element such as an organic light-emitting diode. Each of the main pixels Pm may emit, for example, red, green, blue, or white light, through the organic light-emitting diode. As described above, each of the main pixels Pm described herein may be understood as a pixel that emits light having one color from among red, green, blue, and white. The display area DA may be covered by an encapsulating member described above with reference to FIG. 2 and be protected from external air or moisture.

The sensor area SA is at the inside of the display area DA, and the plurality of auxiliary pixels Pa are arranged over the sensor area SA. The plurality of auxiliary pixels Pa may each include a display element such as an organic light-emitting diode. Each of the auxiliary pixels Pa may emit, for example, red, green, blue, or white light, through the organic light-emitting diode. As described above, each of the auxiliary pixels Pa described herein may be understood as a pixel that emits light having one color from among red, green, blue, and white. The sensor area SA includes the transmitting area TA that may be disposed between two adjacent auxiliary pixels of the plurality of auxiliary pixels Pa.

According to an embodiment, each of the main pixels Pm and each of the auxiliary pixels Pa may include the same pixel circuit. However, the present description is not limited thereto. A pixel circuit included in each of the main pixels Pm and a pixel circuit included in each of the auxiliary pixels Pa may be different from each other.

Since the sensor area SA includes the transmitting area TA, resolution of the sensor area SA may be less than that of the display area DA. For example, resolution of the sensor area SA may be about one half of that of the display area DA. In some embodiments, resolution of the display area DA may be 400 pixels per inch (ppi) or greater, and resolution of the sensor area SA may be about 200 ppi.

Each of the main pixels Pm and the auxiliary pixels Pa may be electrically connected to outer circuits arranged over the non-display area NDA. A first scan driving circuit 110, a second scan driving circuit 120, a terminal 140, a data driving circuit 150, a first power supply line 160, and a second power supply line 170 may be arranged over the non-display area NDA.

The first scan driving circuit 110 may provide a scan signal to each of the main pixels Pm or each of the auxiliary pixels Pa via a scan line SL. The first scan driving circuit 110 may provide an emission control signal to each of the main pixels Pm or each of the auxiliary pixels Pa via an emission control line EL. The second scan driving circuit 120 may be parallel to the first scan driving circuit 110 with the display area DA therebetween. Some of the main pixels Pm and some of the auxiliary pixels Pa arranged over the display area DA may be electrically connected to the first scan driving circuit 110, and the others may be connected to the second scan driving circuit 120. According to another embodiment, the second scan driving circuit 120 may be omitted.

The terminal 140 is on a side of the substrate 100. The terminal 140 may be exposed without being covered by an insulating layer and be electrically connected to a printed circuit board PCB. A terminal PCB-P of the printed circuit board PCB may be electrically connected to the terminal 140 of the display panel 10. The printed circuit board PCB transmits a signal or power of a controller (not shown) to the display panel 10. A control signal generated by the controller may be transmitted to each of the first and second scan driving circuits 110 and 120 through the printed circuit board PCB. The controller may respectively provide first and second power ELVDD and ELVSS (Refer to FIG. 4 described below) to the first and second power supply lines 160 and 170 via first and second connecting lines 161 and 171. The first power voltage ELVDD (of FIG. 4) may be provided to each of the main pixels Pm and each of the auxiliary pixels Pa via a driving voltage line PL connected to the first power supply line 160, and the second power voltage ELVSS (of FIG. 4) may be provided to an opposite electrode of each of the main pixels Pm and each of the auxiliary pixels Pa connected to the second power supply line 170. The driving voltage line PL is extending in a y-direction.

The data driving circuit 150 is electrically connected to a data line DL. A data signal of the data driving circuit 150 may be provided to each of the main pixels Pm and each of the auxiliary pixels Pa via a connecting line 151 connected to the terminal 140 and the data line DL connected to the connecting line 151. Although FIG. 3 shows the data driving circuit 150 on the printed circuit board PCB, the data driving circuit 150 may be on the substrate 100 in another embodiment. For example, the data driving circuit 150 may be between the terminal 140 and the first power supply line 160.

The first power supply line 160 includes a first sub-line 162 and a second sub-line 163 extending parallel in a x-direction with the display area DA therebetween. The x-direction is different from the y-direction. The second power supply line 170 may partially surround the display area DA in the shape of a loop with one side open.

Figure 4:
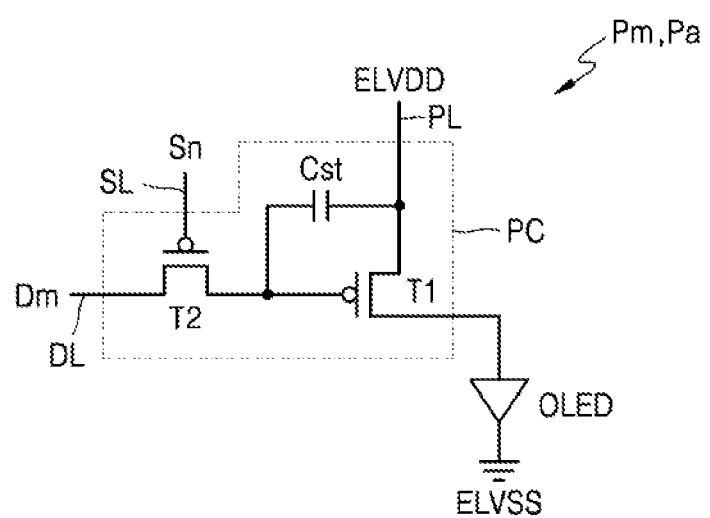
FIG. 4 is an equivalent circuit diagram of one pixel included in the display apparatus of FIG. 1.

FIG. 4 is an equivalent circuit diagram of one pixel included in the display apparatus 1 of FIG. 1.

Referring to FIG. 4, each of the main pixels Pm and the auxiliary pixels Pa includes a pixel circuit PC connected to the scan line SL and the data line DL, and the organic light-emitting diode OLED connected to the pixel circuit PC.

The pixel circuit PC includes a driving thin film transistor T1, a switching thin film transistor T2, and a storage capacitor Cst. The switching thin film transistor T2 is connected to the scan line SL and the data line DL and transmits a data signal Dm input via the data line DL to the driving thin film transistor T1 according to a scan signal Sn input via the scan line SL.

The storage capacitor Cst is connected to the switching thin film transistor T2 and the driving voltage line PL and stores a voltage corresponding to a difference between a voltage transmitted from the switching thin film transistor T2 and the first power voltage ELVDD (or a driving voltage) supplied to the driving voltage line PL.

The driving thin film transistor T1 is connected to the driving voltage line PL and the storage capacitor Cst and may control a driving current flowing through the organic light-emitting diode OLED from the driving voltage line PL in response to a voltage value stored in the storage capacitor Cst. The organic light-emitting diode OLED may emit light having predetermined brightness according to the driving current.

Although the pixel circuit PC including two thin film transistors and one storage capacitor has been described with reference to FIG. 4, the present description is not limited thereto. For example, the pixel circuit PC may include seven thin film transistors and one storage capacitor.

Figure 5:
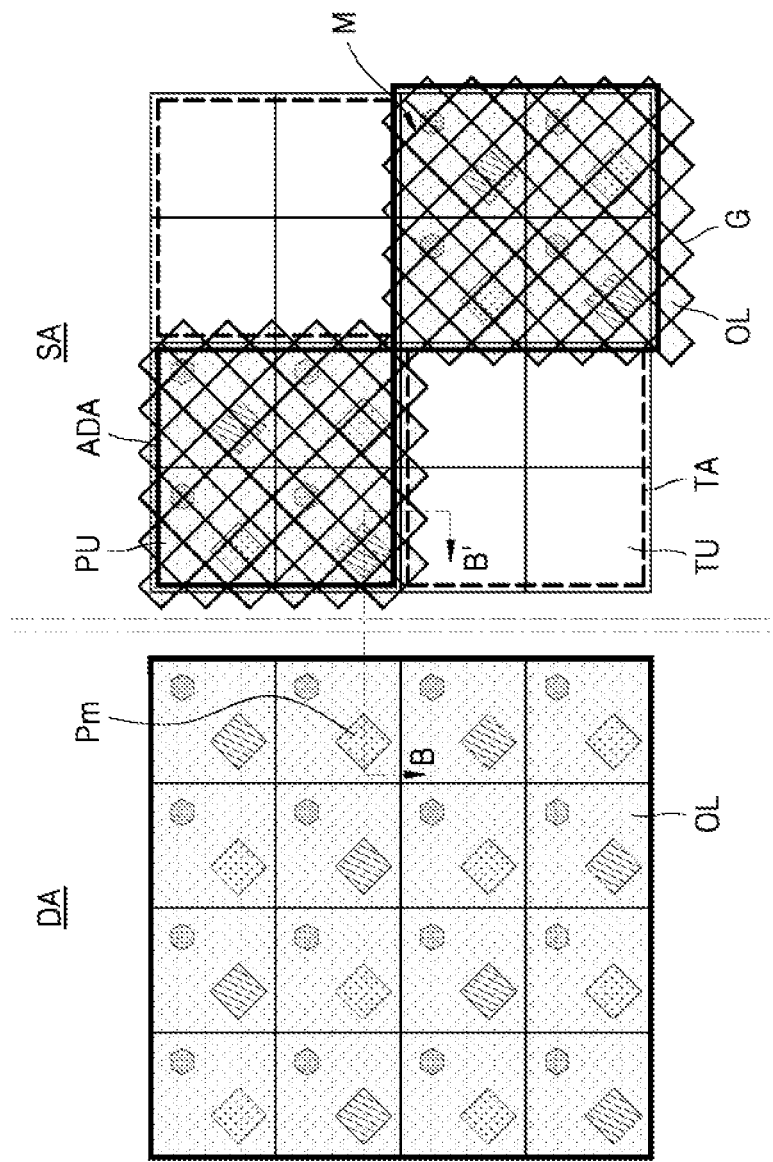
FIG. 5 is a plan view of a portion of the display apparatus of FIG. 1.
Figure 6A:
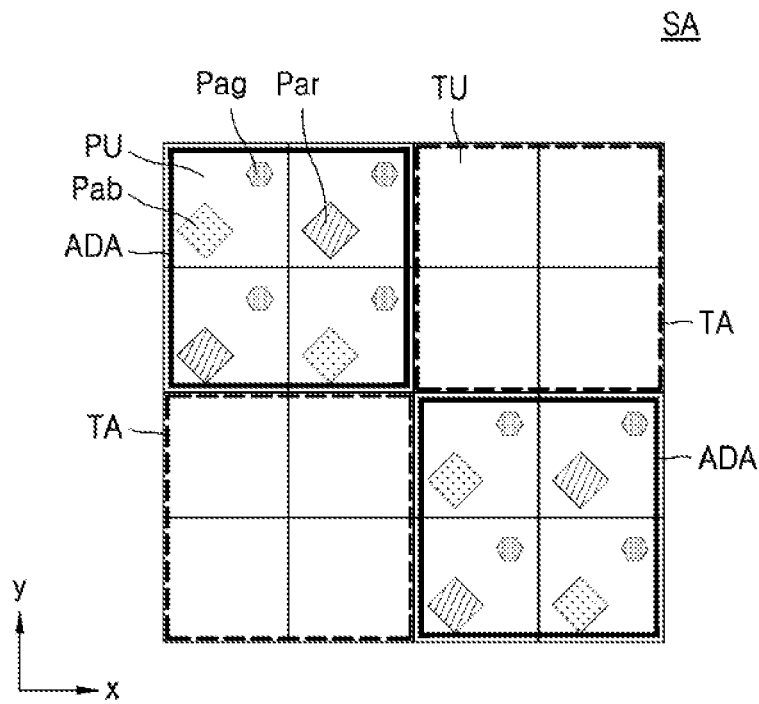
FIG. 6A is a plan view of an example of a sensor area of FIG. 5.
Figure 6B:
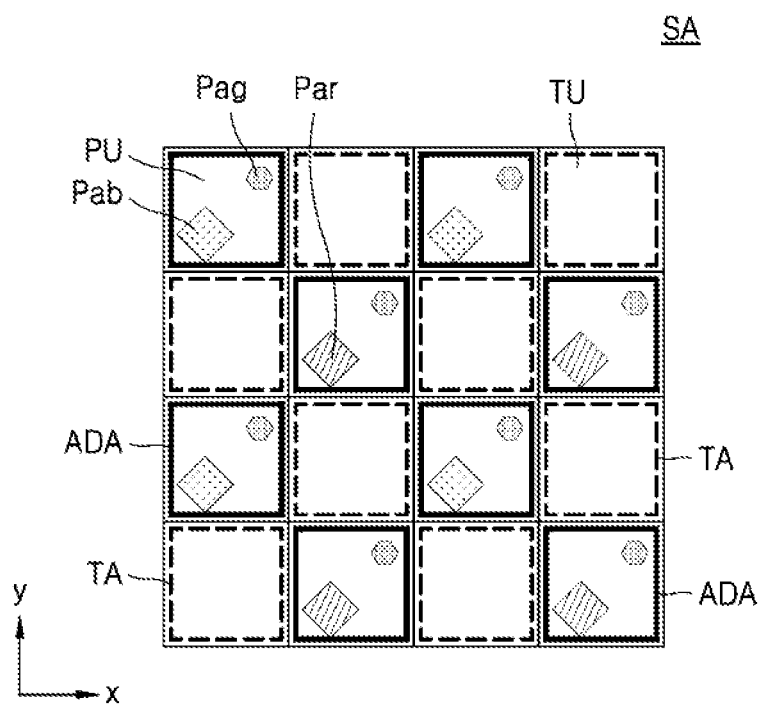
FIG. 6B is a plan view of another example of the sensor area of FIG. 5.

FIG. 5 is a plan view of a portion of the display apparatus 1 of FIG. 1. FIG. 6A is a plan view of an example of the sensor area SA of FIG. 5. FIG. 6B is a plan view of another example of the sensor area SA of FIG. 5.

First, FIG. 5 shows the sensor area SA of the display apparatus 1 (of FIG. 1) according to an embodiment, and the display area DA adjacent to the sensor area SA.

Referring to FIG. 5, the plurality of main pixels Pm are arranged over the display area DA, and a plurality of first display elements are arranged over the display area DA to drive the plurality of main pixels Pm and allow the plurality of main pixels Pm to emit light.

Each of the plurality of first display elements includes the pixel circuit PC (of FIG. 4) corresponding to each of the main pixels Pm, and a display element electrically connected to the pixel circuit PC (of FIG. 4). The pixel circuit PC may include a thin film transistor and a storage capacitor, and the display element may include the organic light-emitting diode OLED.

The sensor area SA includes an auxiliary display area ADA and the transmitting area TA.

The plurality of auxiliary pixels Pa are arranged over the auxiliary display area ADA, and a plurality of second display elements are arranged over the auxiliary display area ADA to drive the plurality of auxiliary pixels Pa and allow the plurality of auxiliary pixels Pa to emit light.

The plurality of second display elements have the same or similar structure as or to the plurality of first display elements described above, and each of the plurality of second display elements includes the pixel circuit PC (of FIG. 4) corresponding to each of the auxiliary pixels Pa, and a display element electrically connected to the pixel circuit PC (of FIG. 4). In this regard, the pixel circuit PC may include a thin film transistor and a storage capacitor, and the organic light-emitting diode OLED may be connected to the pixel circuit PC as a display element.

In the auxiliary display area ADA, a pixel unit PU including at least one of the auxiliary pixels Pa may be defined. The pixel unit PU, which is a result of grouping adjacent auxiliary pixels Pa, may include auxiliary pixels that may emit various colors of light. In an example embodiment, the auxiliary pixels of the pixel unit PU may emit different colors from each other.

According to an embodiment, the pixel unit PU may include at least one of pixels including a pixel that emits red light, a pixel that emits green light, and a pixel that emits blue light. When the pixel unit PU includes two or more pixels, the pixel unit PU may include at least two pixels that emit different colors of light from each other.

A transmitting unit TU is in the transmitting area TA. The transmitting unit TU is a unit element that transmits at least a portion of light incident on the transmitting area TA, and an area of the transmitting area TA is changed by adjusting the number of transmitting units TU.

According to an embodiment, the transmitting unit TU may include a through hole, or alternatively, may include an opening having an upper layer portion removed from a multilayer structure. However, the present description is not limited thereto, and the transmitting unit TU may refer to a structure where a display element for emission is not provided.

An optical layer OL is in the sensor area SA. The optical layer OL is located over at least the auxiliary display area ADA to cover the plurality of second display elements arranged over the auxiliary display area ADA.

According to an embodiment, as shown in FIG. 5, the optical layer OL may be located over the auxiliary display area ADA but may not be located over most of the transmitting area TA. In an example embodiment, the optical layer OL may cover the entire of the auxiliary display area ADA with partial overlap of the transmitting area TA. For example, the optical layer OL may partially overlap the transmitting area TA along a boundary between the transmitting area TA and the auxiliary display area ADA.

In this case, the optical layer OL may include an opening portion that exposes at least a portion of the transmitting unit TU. As an example, the optical layer OL may be in the form of a matrix having an opening portion and thus may expose at least a portion of the transmitting unit TU included in the transmitting area TA. However, the present description is not limited thereto, and as another example, the optical layer OL may be in the form of a pattern corresponding to the auxiliary display area ADA and thus may expose at least a portion of the transmitting unit TU included in the transmitting area TA.

According to another embodiment, the optical layer OL may be provided not only over the auxiliary display area ADA but over a considerable area (for example, 50% or greater) of the transmitting area TA.

In this case, the optical layer OL may include a transparent material, and thus, even when the optical layer OL is on the transmitting unit TU, the optical layer OL may maintain a light-transmissive function of the transmitting unit TU. Accordingly, the optical layer OL may be located over substantially the entire surface of the sensor area SA including the auxiliary display area ADA and the transmitting area TA.

The optical layer OL may have a mesh pattern M, and the mesh pattern M may be formed by forming grooves G extending in at least two directions crossing each other over a surface of the optical layer OL.

FIG. 5 shows the optical layer OL extending to cover the display area DA. In an example embodiment, the optical layer OL may cover the plurality of first display elements corresponding to the plurality of main pixels Pm, and in this case, the optical layer OL covering the display area DA may not include the mesh pattern M. According to another embodiment, the optical layer OL may not be located over the display area DA and may be located over the sensor area SA only.

As shown in FIG. 5, the number of display elements (first display elements, corresponding to the plurality of main pixels Pm) per unit area of the display area DA is greater than that of display elements (second display elements, corresponding to the plurality of auxiliary pixels Pa) per unit area of the sensor area SA. Accordingly, whether the number of display elements per unit area is large or small may be a criterion of making a distinction between the display area DA and the sensor area SA in the display apparatus 1.

The mesh pattern M of the optical layer OL serves as a diffraction grating, and display quality that is close to that of the display area DA may be obtained even in the sensor area SA having fewer display elements per unit area compared to the display area DA by using a function of the diffraction grating. A detailed description thereof will be given below with reference to FIGS. 10 and 11.

Next, FIGS. 6A and 6B show examples of the sensor area SA of FIG. 5.

Referring to FIGS. 6A and 6B, the plurality of auxiliary pixels Pa include a first pixel Par, a second pixel Pag, and a third pixel Pab that are arranged over the auxiliary display area ADA, and the pixel unit PU may be defined by grouping adjacent pixels from among the plurality of auxiliary pixels including the first pixel Par, the second pixel Pag, and the third pixel Pab. In FIG. 6A, the pixel unit PU includes two first pixels, two third pixels and four second pixels, for example. The pixel unit PU may have the same configuration as another pixel unit. In FIG. 6B, the pixel unit PU includes a first pixel unit having one third pixel and one second pixel, and a second pixel unit having one first pixel and one second pixel. The first pixel unit and the second pixel unit have different configurations, but for the convenience of description, each of the first and second pixel units is referred to as the pixel unit PU.

In this regard, the pixel unit PU may include at least one of the first pixel Par that emits red light, the second pixel Pag that emits green light, and the third pixel Pab that emits blue light, and as shown in FIG. 5, colors of light emitted by the auxiliary pixels Par, Pag, and Pab constituting the pixel unit PU may be different from each other. In addition, the number of auxiliary pixels Par. Pag, and Pab included in each pixel unit PU may be identical.

According to an embodiment, as shown in FIG. 6A, a plurality of pixel units PU may be adjacently arranged to form one pixel unit group, and a plurality of transmitting units TU may be adjacently arranged to form one transmitting unit group. For example, FIG. 6A shows each pixel unit group including four pixel units PU and each transmitting unit group including four transmitting units TU. However, this is merely an example, and the number of pixel units PU included in a pixel unit group and the number of transmitting units TU included in a transmitting unit group may be variously modified.

In this regard, the pixel unit group and the transmitting unit group may be alternately arranged. In an example embodiment, a plurality of pixel unit groups may be diagonally arranged in a first direction between the x-direction and the y-direction, and in the same manner, a plurality of transmitting unit groups may also be diagonally arranged in a second direction different from the first direction. Thus, the plurality of pixel unit groups and the plurality of transmitting unit groups may be arranged in the form of a zigzag along at least one direction (the x-direction or the y-direction).

Although the number of pixel units PU included in the pixel unit group and the number of transmitting units TU included in the transmitting unit group are the same as each other in FIG. 6A, the present description is not limited thereto. That is, the number of pixel units PU included in the pixel unit group and the number of transmitting units TU included in the transmitting unit group may be different from each other.

According to another embodiment, as shown in FIG. 6B, the pixel unit PU and the transmitting unit TU may be alternately arranged without being grouped. In this case, the plurality of pixel units PU and the plurality of transmitting units TU may each be diagonally arranged to be arranged in the form of a zigzag along at least one direction (the x-direction or the y-direction).

Likewise, the number of groups of the pixel unit PU and the transmitting unit TU may change according to the size of an image to be implemented by the pixel unit PU, visibility of each image, etc. In addition, by adjusting the number of pixel units PU and the number of transmitting units TU included in the sensor area SA, a relative area of the transmitting area TA to the auxiliary display area ADA may be adjusted, and thus, an amount of light being transmitted in the sensor area SA may be adjusted.

Hereinafter, a stack structure of configurations included in display apparatuses 1A to 1C will be described with reference to FIGS. 7 to 9.

Figure 7:
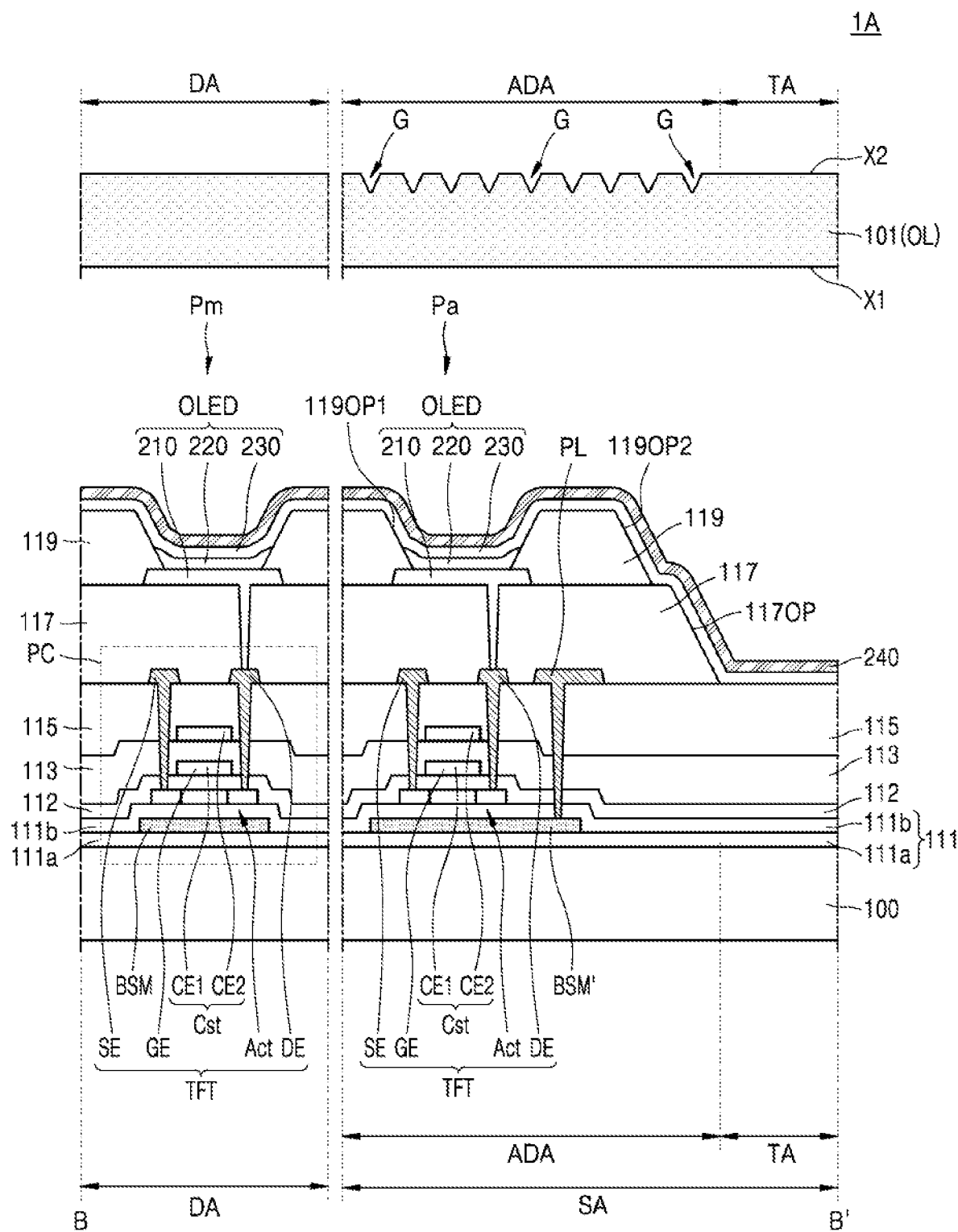
FIG. 7 is a cross-sectional view along line B-B' of FIG. 5.

FIG. 7 is a cross-sectional view according to line B-B' of FIG. 5. FIG. 8 is a cross-sectional view of a portion of a display apparatus 1B according to another embodiment. FIG. 9 is a cross-sectional view of a portion of a display apparatus 1C according to another embodiment.

Figure 8:
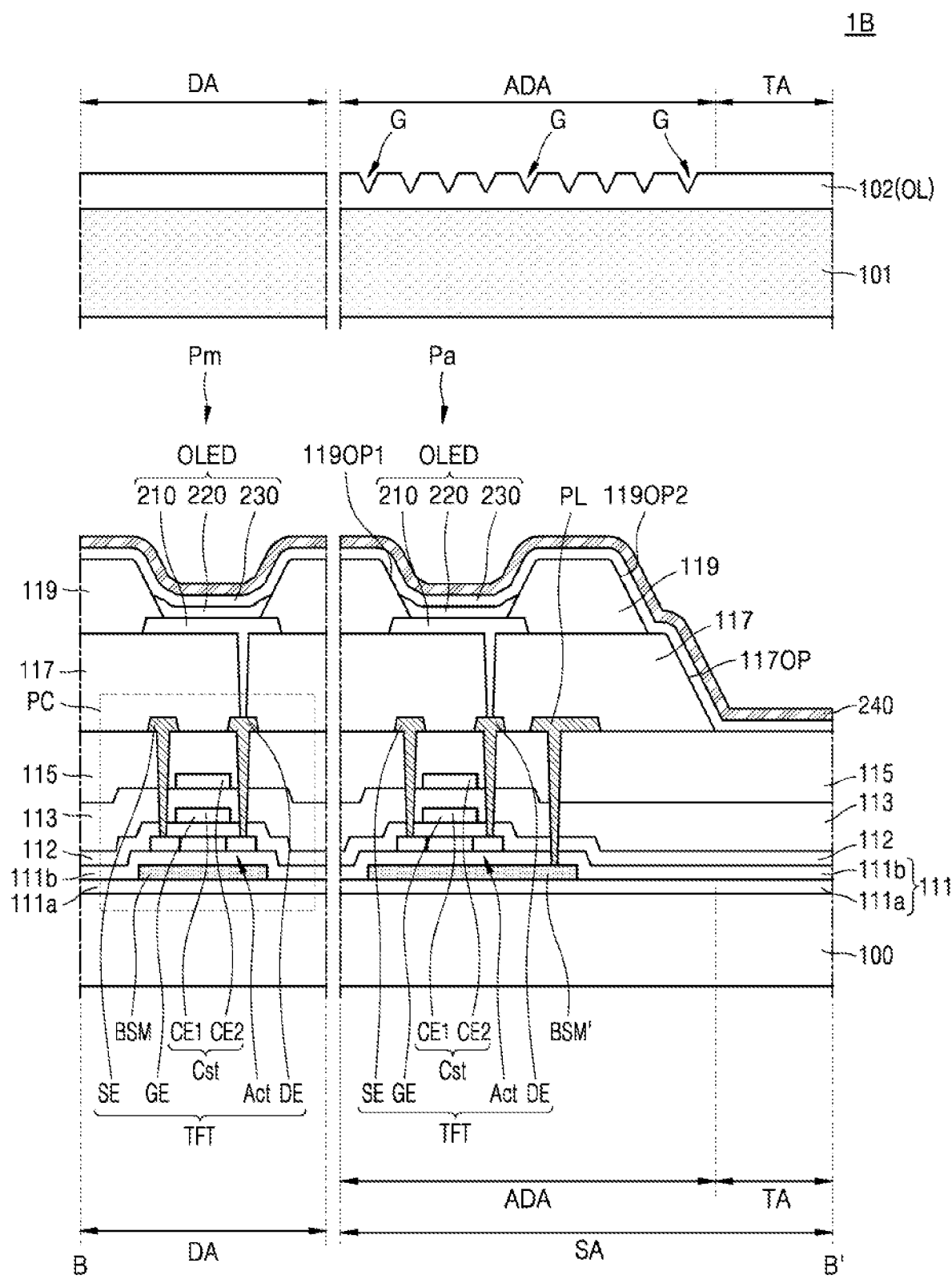
FIG. 8 is a cross-sectional view of a portion of a display apparatus according to another embodiment.
Figure 9:
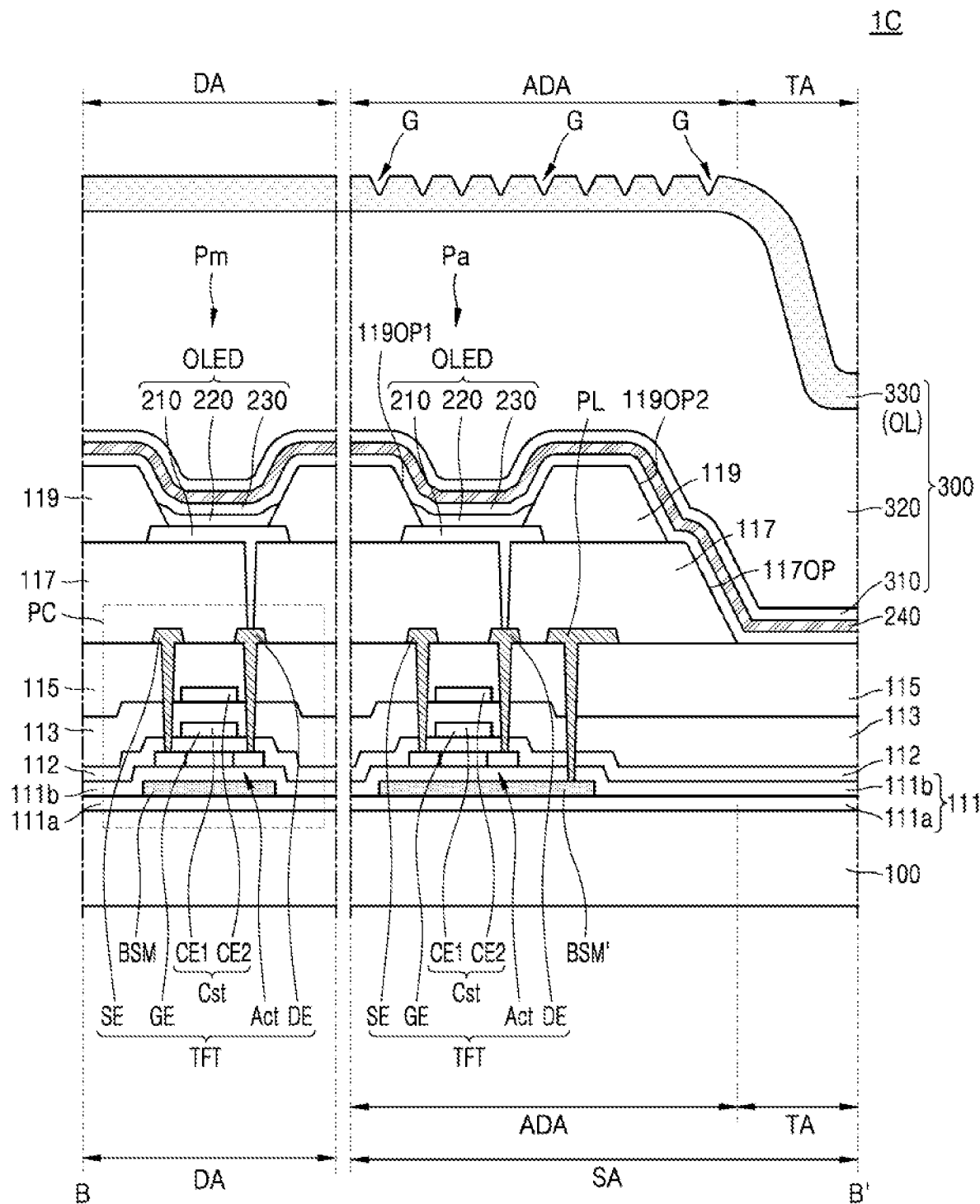
FIG. 9 is a cross-sectional view of a portion of a display apparatus according to another embodiment.

Referring to FIGS. 7 to 9, for the simplicity of description, one of the main pixels Pm is in the display area DA, and the sensor area SA includes the auxiliary display area ADA where one of the auxiliary pixel Pa is provided, and the transmitting area TA.

The pixel circuit PC (of FIG. 4) and the organic light-emitting diode OLED electrically connected to the pixel circuit PC (of FIG. 4) may be arranged in each of the main pixels Pm and each of the auxiliary pixels Pa. Hereinafter, a case where each of the main pixels Pm and the auxiliary pixels Pa includes a driving thin film transistor of the pixel circuit PC (of FIG. 4) will be mainly described for convenience of description.

The main thin film transistor TFT and the storage capacitor Cst on the substrate 100 and a pixel electrode 210 electrically connected thereto are provided. The pixel circuit PC is on the substrate 100, and the organic light-emitting diode OLED is on the pixel circuit PC.

The substrate 100 may include glass or polymer resin. The polymer resin may include PES, polyacrylate, PEI, PEN, PET, PPS, PAR, PI, PC, CAP, or the like. The substrate 100 including polymer resin may be flexible, rollable, or bendable. The substrate 100 may have a multilayer structure including a layer including the above-described polymer resin and an inorganic layer (not shown).

The buffer layer 111 is on the substrate 100. The buffer layer 111 may decrease or prevent intrusion of foreign materials, moisture, or external air from the bottom of the substrate 100 and may provide a planarized surface on the substrate 100. The buffer layer 111 may include an inorganic material such as oxide or nitride, an organic material, or an organic-inorganic complex material and may have a single-layer or multilayer structure including an inorganic material and an organic material. A barrier layer (not shown) may be further included between the substrate 100 and the buffer layer 111. The buffer layer 111 includes a first buffer layer 111a and a second buffer layer 111b stacked on each other.

A gate electrode GE is on a semiconductor layer Act with a first gate insulating layer 112 therebetween. The gate electrode GE may include molybdenum (Mo), aluminum (Al), copper (Cu), titanium (Ti), etc. and may have a single-layer or multilayer structure. As an example, the gate electrode GE may include a single layer of Mo. Some lines such as the scan line SL (of FIG. 4) may be on the same layer as the gate electrode GE. That is, the gate electrode GE and the scan line SL (of FIG. 4) may be on the first gate insulating layer 112.

The first gate insulating layer 112 may include silicon oxide ($SiO_2$), silicon nitride ($SiN_g$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A second gate insulating layer 113 may cover the gate electrode GE. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A first storage capacitive plate CE1 of the storage capacitor Cst may be integrally formed with the gate electrode GE of the main thin film transistor TFF serving as a driving thin film transistor. For example, the gate electrode GE of the driving thin film transistor may serve as the first storage capacitive plate CE1 of the storage capacitor Cst.

A second storage capacitive plate CE2 of the storage capacitor Cst overlaps the first storage capacitive plate CE1 with the second gate insulating layer 113 therebetween. In this case, the second gate insulating layer 113 may serve as a dielectric layer of the storage capacitor Cst. The second storage capacitive plate CE2 may include a conductive material including Mo, Al, Cu, Ti, etc. and may have a multilayer or single-layer structure including the above material. As an example, the second storage capacitive plate CE2 may be a single layer of Mo or a multilayer of Mo/Al/Mo.

Although FIGS. 7 to 9 show the storage capacitor Cst overlapping the driving thin film transistor, the present description is not limited thereto. Various modifications may be made. In an example embodiment, the storage capacitor Cst may be formed without overlapping the driving thin film transistor.

An interlayer insulating layer 115 may cover the second storage capacitive plate CE2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like.

A source electrode SE and a drain electrode DE are on the interlayer insulating layer 115. The source electrode SE and the drain electrode DE may include a highly conductive material. The source electrode SE and the drain electrode DE may include a conductive material including Mo, Al, Cu, Ti, etc. and may have a multilayer or single-layer structure including the above material. According to an embodiment, the source electrode SE and the drain electrode DE may have a multilayer structure of Ti/Al/Ti.

In addition, the data line DL (of FIG. 4) and the driving voltage line PL (of FIG. 4) may be on the interlayer insulating layer 115, and in this regard, the data line DL (of FIG. 4) and the driving voltage line PL (of FIG. 4) may be on the same layer as the source electrode SE and the drain electrode DE.

The pixel circuit PC (of FIG. 4) including the main thin film transistor TFT and the storage capacitor Cst is covered by a planarization layer 117.

The planarization layer 117 may have a planar upper surface to planarize the pixel electrode 210. For example, the planarization layer 117 may provide a planarized upper surface for a subsequent process such as forming the pixel electrode 210. The planarization layer 117 may have a single-layer or multilayer structure including a film including an organic material. The planarization layer 117 may include a general-purpose polymer such as benzocyclobutene (BCB), PI, hexamethyldisiloxane (HMDSO), poly(methyl methacrylate) (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, a blend thereof, etc. In addition, the planarization layer 117 may include an inorganic material. The planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. When the planarization layer 117 includes an inorganic material, chemical planarization polishing may be performed as necessary. The planarization layer 117 may include both of an organic material and an inorganic material.

The pixel electrode 210 may be a (semi)transparent electrode or a reflective electrode. In some embodiments, the pixel electrode 210 may include a reflective film including silver (Ag), magnesium (Mg), Al, platinum (Pt), palladium (Pd), gold (Au), nickel (Ni), neodymium (Nd), iridium (Ir), chromium (Cr), or a compound thereof, and a transparent or semitransparent electrode layer on the reflective film. The transparent or semitransparent electrode layer may include at least one selected from the group including indium tin oxide (ITO), indium zinc oxide (IZO), zinc oxide (ZnO), indium oxide (In$_2$O$_3$), indium gallium oxide (IGO), and aluminum zinc oxide (AZO). In some embodiments, the pixel electrode 210 may have a stack structure of ITO/Ag/ITO.

A pixel-defining film 119 is disposed on the planarization layer 117 with an opening portion 1190P1 that exposes a central portion of the pixel electrode 210 to define an emission area of a pixel. In addition, the pixel-defining film 119 may prevent occurrence of an arc over an edge of the pixel electrode 210 by increasing a distance between the edge of the pixel electrode 210 and an opposite electrode 230 on the pixel electrode 210. The pixel-defining film 119 may be formed by using a method such as spin coating, with an organic insulating material such as PI, polyamide, acrylic resin, BCB, HMDSO, and phenolic resin.

An intermediate layer 220 of the organic light-emitting diode OLED may include an organic emission layer. The organic emission layer may include an organic material including a fluorescent or phosphorescent material emitting red, green, blue, or white light. The organic emission layer may include a low-molecular organic material or a polymer organic material, and functional layers such as a hole transport layer (HTL), a hole injection layer (HIL), an electron transport layer (ETL), and an electron injection layer (EIL) may be selectively further arranged under and on the organic emission layer. The intermediate layer 220 is disposed on the pixel electrode 210. In an example embodiment, the intermediate layer 220 may be integrally formed and thus an intermediate layer disposed on a pixel electrode may be connected to another intermediate layer disposed on another pixel electrode adjacent to the pixel electrode. However, the present description is not limited thereto. Various modifications may be made. For example, the intermediate layer 220 may be separately formed so that an intermediate layer disposed on a pixel electrode may be spaced apart from, without being connected to, another intermediate layer disposed on another pixel electrode adjacent to the pixel electrode.

The opposite electrode 230 may be a transparent electrode or a reflective electrode. In some embodiments, the opposite electrode 230 may be a transparent or semitransparent electrode and may include a metal thin film having low work function including lithium (Li), calcium (Ca), lithium fluoride/calcium (LiF/Ca), lithium fluoride/aluminum (LiF/Al), Al, Ag, Mg, or a compound thereof. In addition, a transparent conductive oxide (TCO) film such as ITO, IZO, ZnO, or In$_2$O$_3$ may be further located on the metal thin film. The opposite electrode 230 may be located over the display area DA and the sensor area SA, and may be on the intermediate layer 220 and the pixel-defining film 119. The opposite electrode 230 may be integrally formed with respect to the organic light-emitting diode OLED and thus may correspond to the pixel electrode 210. For example, an opposite electrode on an organic light-emitting diode may be connected to another opposite electrode on another organic light-emitting diode adjacent to the organic light-emitting diode.

When the pixel electrode 210 is a reflective electrode, and the opposite electrode 230 is a transparent electrode, light emitted from the intermediate layer 220 may be emitted toward the opposite electrode 230. In this case, a display apparatus may be referred to as a top-emission-type display apparatus. When the pixel electrode 210 is a transparent or semitransparent electrode, and the opposite electrode 230 is a reflective electrode, light emitted from the intermediate layer 220 may be emitted toward the substrate 100. In this case, the display apparatus may be referred to as a bottom-emission-type display apparatus. However, the present embodiment is not limited thereto. The display apparatus according to the present embodiment may be a dual-emission-type display apparatus which emits light in both of the top and bottom directions.

A capping layer 240 is disposed on the opposite electrode 230. For example, the capping layer 240 may include LiF and may be formed by thermal deposition. Alternatively, the capping layer 240 may include an inorganic insulating material such as silicon oxide, silicon nitride, or silicon oxynitride. Alternatively, the capping layer 240 may be omitted.

The first electrode layer BSM is disposed below the main pixels Pm. The first electrode layer BSM is disposed between the first buffer layer 111a and the second buffer layer 111b. The first electrode layer BSM may include a conductive material including Mo, Al, Cu, Ti, etc. and may have a single-layer or multilayer structure.

The first electrode layer BSM may be connected to the gate electrode GE of a corresponding main pixel of the main pixels Pm and thus may serve as one of double gate electrodes. However, the present description is not limited thereto. According to another embodiment, the first electrode layer BSM may be connected to a line for receiving constant voltage, for example, the driving voltage line PL of FIG. 4. According to another embodiment, the first electrode layer BSM may be integrally formed so that a first electrode layer below a main pixel electrode may be connected to another first electrode layer below another main pixel or to another first electrode layer below an auxiliary pixel electrode.

The first electrode layer BSM may serve to stabilize characteristics of a thin film transistor included in each of the main pixels Pm.

In an example embodiment, the first electrode layer BSM may not correspond to the entire of the main pixels Pm and may correspond to the bottom of a certain thin film transistor.

In addition, the second electrode layer BSM' may be below the auxiliary pixel Pa. Like the first electrode layer BSM, the second electrode layer BSM' may be between the first buffer layer 111a and the second buffer layer 111b, may include a conductive material including Mo, Al, Cu, Ti, etc., and may have a single-layer or multilayer structure.

The second electrode layer BSM' may be connected to the driving voltage line PL, as shown in FIG. 4, via a contact hole. The driving voltage line PL is disposed on the interlayer insulating layer 115, and the contact hole penetrates through the interlayer insulating layer 115, the second gate insulating layer 113, the first gate insulating layer 112, and the second buffer layer 111b. However, the present description is not limited thereto, and according to another embodiment, the second electrode layer BSM' may be connected to the scan line SL (of FIG. 4) via a contact hole. As described above, as the second electrode layer BSM' is provided for the auxiliary pixels Pa, the main thin film transistor TFT of each of the auxiliary pixels Pa may be protected from external light or constant voltage.

The planarization layer 117 may include a first transmitting opening 1170P corresponding to the transmitting area TA, and the pixel-defining film 119 may include a second transmitting opening 1190P2. In this regard, the first transmitting opening 1170P and the second transmitting opening 1190P2 may constitute the transmitting unit TU described above with reference to FIG. 5, etc.

Accordingly, the first buffer layer 111a, the second buffer layer 111b, the first gate insulating layer 112, the second gate insulating layer 113, the interlayer insulating layer 115, and the opposite electrode 230 may be stacked in the transmitting area TA. In an example embodiment, an organic material layer of the intermediate layer 220 over the entire surface of the substrate 100, for example, an HTL, an HIL, an ETL, an EIL, etc., may be further located between the interlayer insulating layer 115 and the opposite electrode 230 in the transmitting area TA.

In some embodiments, the opposite electrode 230 may be removed in the transmitting area TA. According to another embodiment, inorganic insulating layers, that is, the first buffer layer 111a, the second buffer layer 111b, the first gate insulating layer 112, the second gate insulating layer 113, and the interlayer insulating layer 115, may all be removed in the transmitting area TA. In this case, removal of the inorganic insulating layers may be performed by the same etching process when the contact hole for connecting the second electrode layer BSM' to the driving voltage line PL is formed.

In the display apparatus 1A shown in FIG. 7, an encapsulation substrate 101 facing the substrate 100 may be on the capping layer 240. Thus, the encapsulation substrate 101 may cover a plurality of first display elements arranged over the display area DA and a plurality of second display elements arranged over the auxiliary display area ADA.

The encapsulation substrate 101 may be substantially parallel to the substrate 100 and be attached to the substrate 100 by a sealing member (not shown) between the substrate 100 and the encapsulation substrate 101.

The encapsulation substrate 101 may include glass or polymer resin. The polymer resin may include PES, polyacrylate, PEI, PEN, PET, PPS, PAR, PI, PC, CAP, or the like. The encapsulation substrate 101 including polymer resin may be flexible, rollable, or bendable. The encapsulation substrate 101 may have a multilayer structure including a layer including the above-described polymer resin and an inorganic layer (not shown) and may include the same material as that of the substrate 100.

The encapsulation substrate 101 may have a first side X1 facing the substrate 100 and a second side X2 opposite the first side X1. The second side X2 of the encapsulation substrate 101 includes the grooves G described with reference to FIG.

The grooves G may extend in at least two directions crossing each other and thus constitute the mesh pattern M (of FIG. 5). That is, in the present embodiment, the encapsulation substrate 101 itself may serve as the optical layer OL described above with reference to FIG. 5.

In the display apparatus 1B shown in FIG. 8, the encapsulation substrate 101 facing the substrate 100 may be on the capping layer 240. An insulating layer 102 is disposed on the encapsulation substrate 101. Except that, structures of the main thin film transistor TFT and the organic light-emitting diode OLED and a location, a material, etc. of the encapsulation substrate 101 are the same as or similar to those of the embodiment described above with reference to FIG. 7.

The grooves G as discussed with reference to FIG. 5 are formed on a surface of the insulating layer 102. The grooves G may extend in at least two directions crossing each other and thus constitute the mesh pattern M (of FIG. 5), and accordingly, unlike that shown in FIG. 7, the insulating layer 102 on the encapsulation substrate 101 may serve as the optical layer OL described above with reference to FIG. 5.

According to an embodiment, the insulating layer 102 may include at east one of silicon oxide, silicon nitride, and silicon oxynitride.

In the display apparatus 1C shown in FIG. 9, instead of the encapsulation substrate 101 (of FIGS. 7 and 8) described above, the thin film encapsulation layer 300, as described with reference to FIG. 2, may be on the capping layer 240. Like the encapsulation substrate 101 (of FIGS. 7 and 8) described above, the thin film encapsulation layer 300 may cover a plurality of first display elements arranged over the display area DA and a plurality of second display elements arranged over the auxiliary display area ADA.

The thin film encapsulation layer 300 may include at least one organic encapsulation layer and at least one inorganic encapsulation layer.

According to an embodiment, FIG. 9 shows the thin film encapsulation layer 300 including the first inorganic encapsulation layer 310, the second inorganic encapsulation layer 330 and the organic encapsulation layer 320 therebetween. According to another embodiment, the number of organic encapsulation layers and the number and stacking order of inorganic encapsulation layers may be changed.

The first inorganic encapsulation layer 310 may be conformally formed on the capping layer 240 of which an upper surface is not planarized. The organic encapsulation layer 320 covers the first inorganic encapsulation layer 310, providing a planarized surface for the second inorganic encapsulation layer 330. In an example embodiment, the organic encapsulation layer 320 may have a substantially planar upper surface on the display area DA and the auxiliary display area ADA.

The organic encapsulation layer 320 may include PET, PEN, PC, PI, polyethylene sulfonate, polyoxymethylene, PAR, HMDSO, acrylic resin (for example, PMMA, poly (acrylic acid), etc.), or any combination thereof.

The second inorganic encapsulation layer 330 covers the organic encapsulation layer 320. In an example embodiment, the second inorganic encapsulation layer 330 may include silicon oxide, silicon nitride, silicon oxynitride or a combination thereof. The second inorganic encapsulation layer 330 may directly contact the first inorganic encapsulation layer 310 on an edge area of the display apparatus 1 (of FIG. 1) and thus may prevent the organic encapsulation layer 320 from being exposed to the outside of the display apparatus 1 (of FIG. 1).

In this regard, the grooves G, described with reference to FIG. 5, may be formed on a surface of the second inorganic encapsulation layer 330 located on top of the thin film encapsulation layer 300. The grooves G may extend in at least two directions crossing each other and thus constitute the mesh pattern M (of FIG. 5), and accordingly, the second inorganic encapsulation layer 330 of the thin film encapsulation layer 300 may serve as the optical layer OL described above with reference to FIG. 5.

Figure 10:
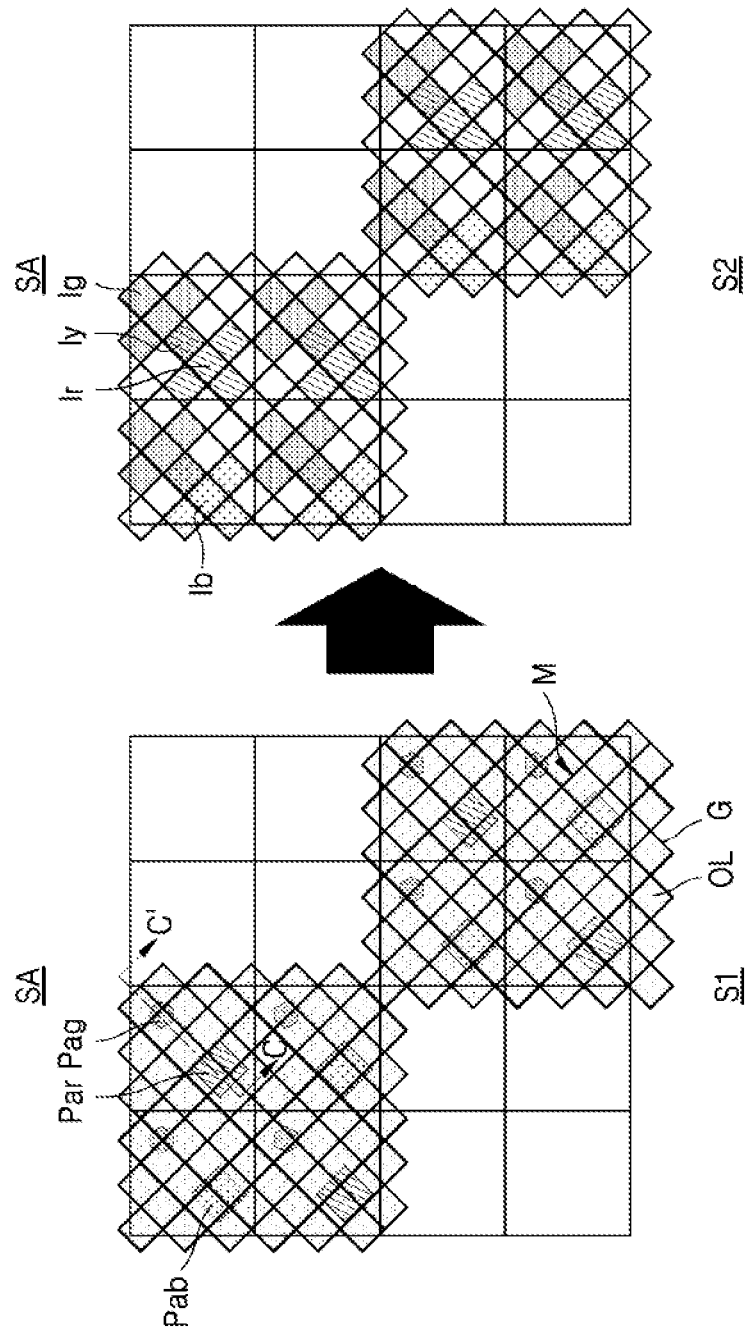
FIG. 10 is a plan view of a portion of a display apparatus and an image displayed by the portion, according to an embodiment.
Figure 11:
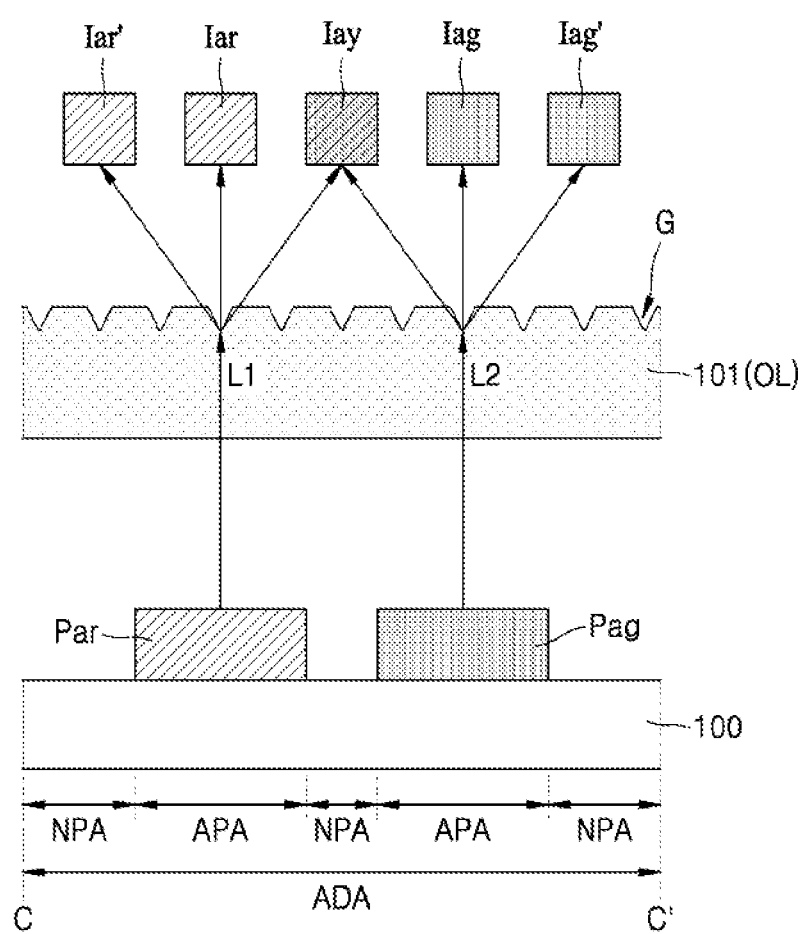
FIG. 11 is a cross-sectional view along line C-C' of FIG. 10.

FIG. 10 is a plan view of an image displayed by a portion of a display apparatus according to an embodiment. FIG. 11 is a cross-sectional view according to line C-C' of FIG. 10.

As shown in a first operation S1 of FIG. 10, the optical layer OL is in the sensor area SA, and is located over at least the auxiliary display area ADA to overlap a plurality of second display elements arranged over the auxiliary display area ADA.

As shown in FIG. 10, the optical layer OL may be located over the auxiliary display area ADA but may not be located over most of the transmitting area TA, the optical layer OL may extend to the transmitting area TA as well as the auxiliary display area ADA.

In this regard, the optical layer OL may include the mesh pattern M serving as a diffraction grating, and the mesh pattern M may be obtained by processing the grooves G on an upper surface of the optical layer OL as shown in FIG. 11. The optical layer OL may be one of the encapsulation substrate 101 shown in FIG. 7, the insulating layer 102 on the encapsulation substrate 101 shown in FIG. 8, and the second inorganic encapsulation layer 330 of the thin film encapsulation layer 300 shown in FIG. 9, and FIG. 11 shows a case where the optical layer OL is the encapsulation substrate 101.

As shown in FIG. 11, red light L1 emitted from the first pixel Par is divided into a plurality of beams by the grooves G of the optical layer OL serving as a diffraction grating and thus implements a plurality of red images.

For example, at least one second red image Iar' that is the same as a first red image Iar corresponding to a pixel area APA where the first pixel Par is located may be implemented over a non-pixel area NPA, which is a peripheral area of the pixel area APA of the first pixel Par. Thus, a second red image Iar' obtained by reproducing the first red image Iar may be adjacent to the first red image Iar.

Likewise, green light L2 emitted from the second pixel Pag is divided into a plurality of beams by reaching the groove G of the optical layer OL serving as a diffraction grating and thus implements a plurality of green images.

To be more concrete, at least one second green image Iag' that is the same as a first green image Iag corresponding to the pixel area APA where the second pixel Pag is located may be implemented over the non-pixel area NPA, which is a peripheral area of the pixel area APA of the second pixel Pag. Thus, a second green image Iag' obtained by reproducing the first green image Iag may be adjacent to the first green image Iag.

A yellow image Iay, which is a mixed color of red and green, may be implemented over the non-pixel area NPA where a red image Iar, which is a reproduced image of the first pixel Par, and a second green image Iag', which is a reproduced image of the second pixel Pag, overlap each other.

Accordingly, as shown in a second operation S2 of FIG. 10, a red image Ir may be implemented so as to correspond to not only the first pixel Par but also a peripheral area of the first pixel Par, a green image Ig may be implemented so as to correspond to not only the second pixel Pag but also a peripheral area of the second pixel Pag, and a blue image Ib may be implemented so as to correspond to not only the third pixel Pab but also a peripheral area of the third pixel Pab. That is, an image of a color of the sensor area SA may be larger than that of the color of the display area DA (of FIG. 5), and thus, display quality of the sensor area SA may be prevented from being significantly degraded compared to display quality of the display area DA (of FIG. 5).

As described above, according to one or more embodiments, a display apparatus may include an optical layer in an auxiliary display area where the number of display elements per unit area is relatively small compared to a display area, the optical layer including a mesh pattern serving as a diffraction grating, and thus, even in the auxiliary display area, display quality such as resolution, visibility, etc. may be as good as that of the display area.

According to one or more embodiments, overall display quality may be improved by improving resolution, visibility, etc.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate including a display area and a sensor area, the sensor area including an auxiliary display area and a transmitting area;
a plurality of first display elements arranged over the display area;
a plurality of second display elements arranged over the auxiliary display area;
a plurality of transmitting units arranged in the transmitting area and configured to transmit at least a portion of light incident on the transmitting area; and
an optical layer comprising a mesh pattern covering at least the plurality of second display elements.

2. The display apparatus of claim 1,
wherein the plurality of second display elements are grouped into a plurality of pixel units each of which is defined by four adjacent transmitting units of the plurality of transmitting units.

3. The display apparatus of claim 1,
wherein the plurality of second display elements are grouped into a plurality of pixel units, and
wherein each of the plurality of pixel units and each of the plurality of transmitting units are alternately arranged.

4. The display apparatus of claim 1,
wherein each of the plurality of first display elements and the plurality of second display elements comprises:
a thin film transistor;
a pixel electrode electrically connected to the thin film transistor;
an emission layer on the pixel electrode; and
an opposite electrode on the emission layer.

5. The display apparatus of claim 1,
wherein the optical layer further comprises an opening portion that exposes at least a portion of each of the plurality of transmitting units.

6. The display apparatus of claim 1,
wherein the optical layer is configured to encapsulate at least the plurality of first display elements and the plurality of second display elements.

7. The display apparatus of claim 1, further comprising:
an encapsulation substrate disposed between the substrate and the optical layer to cover at least the plurality of first display elements and the plurality of second display elements.

8. The display apparatus of claim 7,
wherein the optical layer is formed of an insulating layer of which a first surface is in contact with the encapsulation substrate and of which a second surface opposite the first surface includes the mesh pattern.

9. The display apparatus of claim 8,
wherein the insulating layer comprises at least one of silicon oxide, silicon nitride, and silicon oxynitride.

10. The display apparatus of claim 1, further comprising:
an organic encapsulation layer disposed between the optical layer and the substrate.

11. The display apparatus of claim 10,
wherein the optical layer is formed of an inorganic encapsulation layer, and
wherein the inorganic encapsulation layer includes a first surface that is in contact with the organic encapsulation layer and a second surface that is opposite the first surface and includes the mesh pattern.

12. The display apparatus of claim 1,
wherein the mesh pattern comprises a plurality of grooves on a surface of the optical layer, and
wherein a first group of the plurality of grooves extends in a first direction and a second group of the plurality of grooves extends in a second direction different from the first direction.

13. A display apparatus comprising:
a substrate including a display area and a sensor area, the sensor area including an auxiliary display area and a transmitting area;
a plurality of first display elements arranged over the display area;
a plurality of second display elements arranged over the auxiliary display area;
a plurality of transmitting units arranged in the transmitting area and configured to transmit at least a portion of light incident on the transmitting area; and
an optical layer including a diffraction grating covering at least the plurality of second display elements,
wherein the number of the plurality of second display elements per a unit area is less than the number of the plurality of first display elements per the unit area.

14. The display apparatus of claim 13,
wherein the plurality of second display elements are grouped into a plurality of pixel units each of which is defined by four adjacent transmitting units of the plurality of transmitting units.

15. The display apparatus of claim 13,
wherein the plurality of second display elements are grouped into a plurality of pixel units, and
wherein each of the plurality of pixel units and each of the plurality of transmitting units are alternately arranged.

16. The display apparatus of claim 13,
wherein the optical layer further comprises an opening portion that exposes at least a portion of each of the plurality of transmitting units.

17. The display apparatus of claim 13,
wherein each of the plurality of first display elements and the plurality of second display elements comprises:
a thin film transistor;
a pixel electrode electrically connected to the thin film transistor;
an emission layer on the pixel electrode; and
an opposite electrode on the emission layer.

18. The display apparatus of claim 14,
wherein the diffraction grating is configured to generate a first diffracted light from a first light of a first pixel and a second diffracted light from a second light of a second pixel adjacent to the first pixel so that the first light and the second light are mixed to generate a third light and the third light is emitted from a region, where no pixel exists, between the first pixel and the second pixel.

19. The display apparatus of claim 18,
wherein the first light, the second light and the third light are different from each other.

20. The display apparatus of claim 13,
wherein the diffraction grating comprises a plurality of grooves on a surface of the optical layer, and
wherein the plurality of grooves include a first group of grooves extending in a first direction and a second group of grooves extending in a second direction different from the first direction.

* * * * *